(12) United States Patent
Liu

(10) Patent No.: US 10,658,621 B2
(45) Date of Patent: May 19, 2020

(54) OLED PANEL AND MANUFACTURING METHOD THEREOF AND OLED DISPLAY

(71) Applicant: Wuhan China Star Optoelectronics Semiconductor Display Technology Co., Ltd., Wuhan, Hubei (CN)

(72) Inventor: Sheng Liu, Guangdong (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/040,591

(22) Filed: Jul. 20, 2018

(65) Prior Publication Data

US 2019/0312234 A1    Oct. 10, 2019

Related U.S. Application Data

(63) Continuation of application No. PCT/CN2018/087854, filed on May 22, 2018.

(30) Foreign Application Priority Data

Apr. 9, 2018    (CN) .......................... 2018 1 0312248

(51) Int. Cl.
*H01L 51/52* (2006.01)
*H01L 27/32* (2006.01)
*H01L 51/00* (2006.01)
*H01L 51/56* (2006.01)

(52) U.S. Cl.
CPC ...... *H01L 51/5271* (2013.01); *H01L 27/3246* (2013.01); *H01L 51/0097* (2013.01); *H01L 51/56* (2013.01); *H01L 2227/323* (2013.01); *H01L 2251/301* (2013.01); *H01L 2251/5338* (2013.01)

(58) Field of Classification Search
CPC . H01L 51/5271; H01L 51/0097; H01L 51/56; H01L 27/3246
See application file for complete search history.

(56) References Cited

U.S. PATENT DOCUMENTS

| 9,379,357 | B2 | 6/2016 | Liu et al. | |
| 9,685,634 | B2 | 6/2017 | Huangfu et al. | |
| 2007/0131911 | A1* | 6/2007 | Ito | H01L 51/0021 |
| | | | | 252/500 |
| 2008/0169461 | A1 | 7/2008 | Park | |
| 2014/0361265 | A1 | 12/2014 | Liu et al. | |
| 2015/0014636 | A1* | 1/2015 | Kang | H01L 51/5253 |
| | | | | 257/40 |
| 2015/0249232 | A1* | 9/2015 | Shintani | H01L 51/0013 |
| | | | | 438/23 |

(Continued)

FOREIGN PATENT DOCUMENTS

| CN | 107369778 A | 11/2017 |
| JP | 2012124103 A | 6/2012 |

*Primary Examiner* — Christine A Enad

(57) ABSTRACT

The present disclosure provides an OLED panel and a manufacturing method thereof and OLED display. The OLED panel includes a reflecting wall located between two adjacent light-emitting regions and within a pixel defining layer. Therefore, the present disclosure can improve light emission rate, reduce power consumption and prolong service life of device, and eliminate mixing phenomenon caused by mixing different color light emitted from adjacent light-emitting regions.

17 Claims, 3 Drawing Sheets

(56) References Cited

U.S. PATENT DOCUMENTS

2016/0359142 A1 12/2016 Huangfu et al.
2017/0194602 A1* 7/2017 Cui .................... H01L 51/56
2018/0329126 A1* 11/2018 Li ..................... B29D 11/00644

* cited by examiner

US 10,658,621 B2

OLED PANEL AND MANUFACTURING METHOD THEREOF AND OLED DISPLAY

CROSS-REFERENCE TO RELATED APPLICATIONS

The present application is a continuation application of International (PCT) Patent Application No. PCT/CN2018/087854, filed on May 22, 2018, which claims foreign priority of Chinese Patent Application No. 201810312248.X, filed on Apr. 9, 2018 in the State Intellectual Property Office of China, the entire contents of which are hereby incorporated by reference.

TECHNICAL FIELD

The described embodiments relate to display technologies, and in particular to an organic light-emitting diode (OLED) panel and a manufacturing method thereof and an OLED display.

BACKGROUND

Compared with a traditional liquid crystal display (LCD) panel, an OLED panel is regarded as next generation display technology because of its advantages of quick reaction, high contrast, and wide viewing angle. As shown in FIG. 1, an OLED panel 10 generally includes a thin film transistor (TFT) substrate 11, a pixel defining layer (PDL) 12, a plurality of organic light-emitting units 13, and a package layer 14 for sealing. The PDL 12, the organic light-emitting units 13, and the package layer 14 are located on the TFT substrate 11. Each of the organic light-emitting units 13 is located within a light-emitting region 15 defined by PDL 12. The organic light-emitting unit 13 includes an anode 131, a cathode 132, and a light-emitting layer 133. When a voltage is applied to the anode 131 and the cathode 132, electrons and holes from the cathode 132 and the anode 131 are injected into an electronic transport layer and an electronic hole transport layer respectively, and then transferred to the light-emitting layer 133, to excite the light-emitting layer to emit visible light.

In order to improve light emission rate of the OLED panel 10, the related art generally adds a reflecting layer below each light-emitting region 15 or increases surface roughness below the light-emitting region 15. However, these methods cannot avoid the light emitted from adjacent light-emitting regions 15. Thus, these methods improve the light emission rate limitedly, it is difficult to reduce power consumption and prolong service life of an OLED device, and cannot eliminate mixing phenomenon caused by mixing different color light emitted from adjacent light-emitting regions.

SUMMARY

In view of this, the present disclosure provides an OLED panel and its manufacturing method and an OLED display, which can improve light emission rate, reduce power consumption and prolong service life of an OLED device, and eliminate mixing phenomenon caused by mixing different color light emitted from adjacent light-emitting regions.

An OLED panel of according to an embodiment of the present disclosure includes a TFT substrate and a pixel defining layer located on the TFT substrate. The pixel defining layer defines a plurality of light-emitting regions of the OLED panel on the TFT substrate. The OLED panel also includes a reflecting wall located between two adjacent light-emitting regions and within the pixel defining layer.

An OLED display of according to an embodiment of the present disclosure includes an OLED panel, wherein the OLED panel includes a TFT substrate and a pixel defining layer located on the TFT substrate. The pixel defining layer defines a plurality of light-emitting regions of the OLED panel on the TFT substrate. The OLED panel also includes a reflecting wall located between two adjacent light-emitting regions and within the pixel defining layer.

A manufacturing method of an OLED panel according to an embodiment of the present disclosure includes:

providing a TFT substrate;

forming anodes of organic light-emitting units on the TFT substrate;

forming a reflecting wall and a pixel defining layer on the TFT substrate, wherein the pixel defining layer defines a plurality of light-emitting regions of the OLED panel on the TFT substrate, and the reflecting wall is located between two adjacent light-emitting regions and within the pixel defining layer; and forming other layers of the organic light-emitting unit on the light-emitting region defined by the pixel defining layer, wherein the other layers include the light-emitting layer and a cathode.

The present disclosure has the following advantages: different from the related art, the present disclosure can increase light emission rate by adding the reflecting wall between two adjacent light-emitting regions within the pixel defining layer, which can improve light emission rate, reduce power consumption and prolong service life of the OLED device, and eliminate mixing phenomenon caused by mixing different color light emitted from adjacent light-emitting regions.

DETAILED DESCRIPTION

A main purpose of the present disclosure is: the present disclosure can increase light emission rate by adding a reflecting wall between two adjacent light-emitting regions within a pixel defining layer, which can improve light emission rate, reduce power consumption and prolong service life of an OLED device, and eliminate mixing phenomenon caused by mixing different color light emitted from adjacent light-emitting regions.

The following provides a clear and complete description of each exemplary embodiment of the present disclosure in conjunction with the figures. Without conflict, the following embodiments and the characteristics in the embodiments may be combined with each other. Furthermore, the directional terms used throughout the present disclosure, such as "up" and "down", are intended to better describe the technical scheme of each embodiment and are not intended to limit the scope of protection of the present disclosure.

Figure 1:
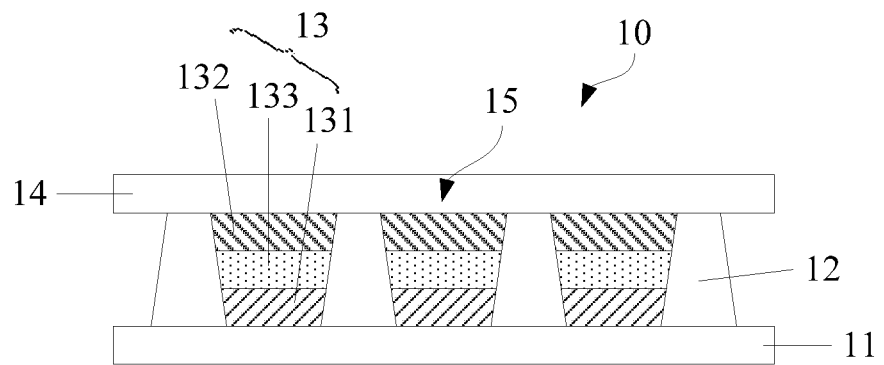
FIG. 1 is a schematic diagram of an OLED panel of the related art.
Figure 2:
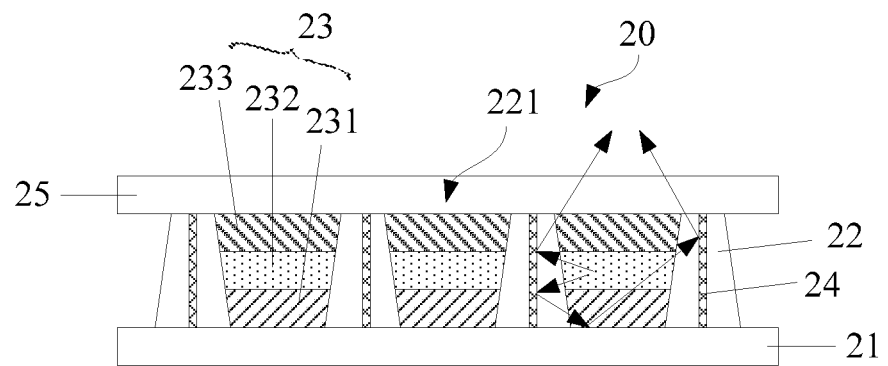
FIG. 2 is a schematic diagram of an OLED panel according to an embodiment of the present disclosure.

Referring to FIG. 2, it shows a schematic diagram of an OLED panel of the present disclosure. The OLED panel 20 includes a thin film transistor (TFT) substrate 21, a pixel defining layer 22, a plurality of organic light-emitting units 23, a reflecting wall 24, and a package layer 25. The pixel defining layer 22, the organic light-emitting units 23, and the reflecting wall 24 are located on the TFT substrate 21. The package layer 25 is configured for sealing.

The pixel defining layer 22 defines a plurality of light-emitting regions 221 of the OLED panel 20. The pixel defining layer 22 may be made of transparent insulating materials with properties of water and oxygen insulation, such as silicon dioxide ($SiO_2$), silicon nitrogen compound (SiNx), indium tin oxide (ITO) and so on.

The reflecting wall 24 is located between two adjacent light-emitting regions 221 and within the pixel defining layer 22, to reflect light on its surface. In one embodiment, for example, in conjunction with FIG. 3, four reflecting walls 24 surround each light-emitting region 221 along a direction perpendicular to the TFT substrate 21. The four reflecting walls 24 may be connected head-to-tail, that is, the four reflecting walls 24 are located completely surround the light-emitting region 21. Of course, the present disclosure may also provide that four reflecting walls 24 surround each light-emitting region 221 and not connected head-to-tail. Alternatively, the number of the reflecting walls 24 surrounding each light-emitting region 221 may be less than four, in which case the plurality of reflecting walls 24 are partially surrounding the light-emitting region 221. Alternatively, each reflecting wall 24 is not an entire wall surface structure, but includes a plurality of wall surfaces spaced surrounding the light-emitting region 221.

The organic light-emitting unit 23 is located on the light-emitting region 221. Specially, the organic light-emitting unit 23 includes an anode 231, a light-emitting layer 232, a cathode 233, an electronic transport layer, and an electronic hole transport layer. The anode 231 is located on the TFT substrate 21. The light-emitting layer 232, the electronic transport layer, and the electronic hole transport layer are located between the anode 231 and the cathode 233.

Figure 3:
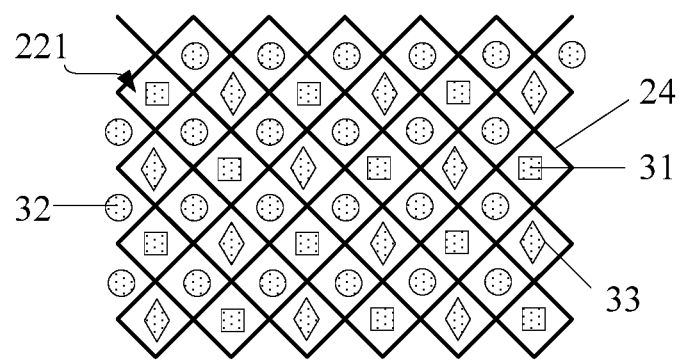
FIG. 3 is a top view diagram of an OLED panel according to an embodiment of the present disclosure.

In combination with FIGS. 2 and 3, each light-emitting region 221 can be considered as each sub-pixel of OLED panel 20. In particular, the light-emitting layer 232 of a red sub-pixel 31 has red light-emitting material, the light-emitting layer 232 of a green sub-pixel 32 has green light-emitting material, and the light-emitting layer 232 of a blue sub-pixel 33 has blue light-emitting material.

In conjunction with directions of light transmission shown by the straight arrow in FIG. 2, when light emitted by the organic light-emitting unit 23 is transmitted from a light-emitting region 221 to an adjacent light-emitting region 221, the reflecting wall 24 reflects the light back to the light-emitting region 221 and ultimately radiates the light from the upper part of the light-emitting region 221. Therefore, the present disclosure can improve light emission rate, reduce power consumption and prolong service life of device, and eliminate mixing phenomenon caused by mixing different color light emitted from adjacent light-emitting regions.

From the above, it can be seen that the reflecting wall 24 needs to have very good light reflection effect, and the present disclosure can limit the light reflectivity of the reflecting wall 24 to be at least 95%. In an actual application scenario, the present disclosure may select silver (Ag) to form the reflecting wall 24. Furthermore, the shape of the reflecting wall 24 can be adapted according to actual needs and the manufacturing method employed. For example, as shown in FIG. 2, thickness of the reflecting wall 24 is unchanged from top to bottom, in which case the cross section of the reflecting wall 24 is rectangular. Alternatively, thickness of the reflecting wall 24 may be increased gradually from top to bottom, in which case the cross section of the reflecting wall 24 is trapezoid. In addition, in order to further ensure the light reflection effect of the reflecting wall 24, heights of the reflecting wall 24 and the pixel defining layer 22 can be configured to be equal.

In the present disclosure, the TFT substrate 21 may be a flexible substrate, wherein the OLED panel 20 is a flexible display panel. The TFT substrate 21 may includes a baseboard, a TFT layer, and a flat layer. The TFT layer and the flat layer are located on the baseboard. The pixel defining layer 22, the organic light-emitting unit 23, and the reflecting wall 24 are all located on the flat layer. The TFT layer includes a gate, a source, a drain, and an active layer etc. The flat layer is provided with a through hole that exposes the drain of the TFT layer. The anode 231 of the organic light-emitting unit 23 fills the through hole and contacts the drain of the TFT layer.

The present disclosure does not limit structure and material of the TFT in the TFT layer, for example, the TFT may be of either a bottom-gate-type or a top-gate-type. Also, for example, metal traces or conductive patterns in the TFT may be made of indium tin oxide (ITO), or one or more mixtures of Mo, Al, Ti, Cu, etc. The structure of the OLED panel 20 is further described below in conjunction with the TFT shown in FIG. 4.

Figure 4:
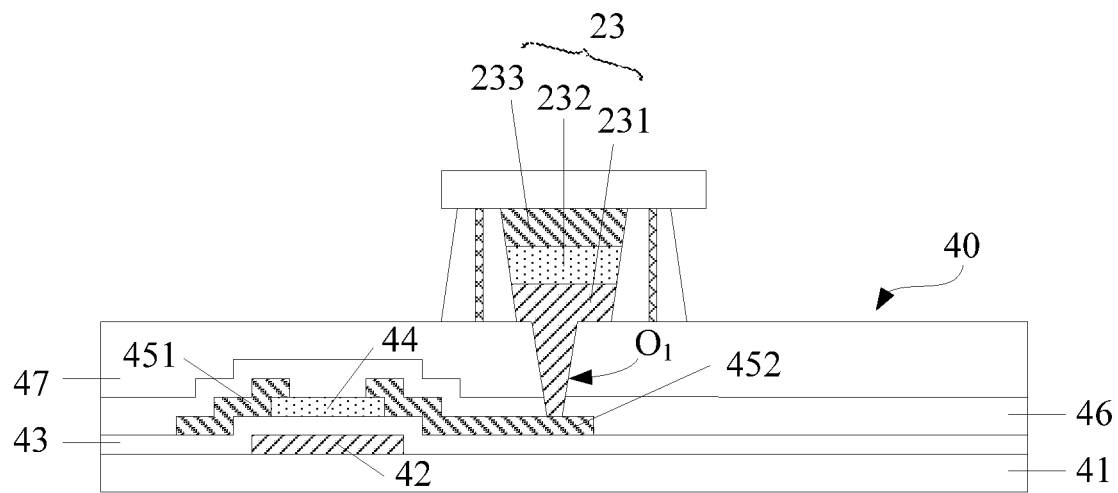
FIG. 4 is a schematic diagram of the OLED panel with bottom-gate-type TFT of FIG. 2 of the present disclosure.

Referring to FIG. 4, it shows a schematic diagram of an OLED panel with bottom-gate-type TFT of FIG. 2 of the present disclosure. In combination with FIGS. 2 and 4, the TFT layer 40 includes layers sequentially formed on the baseboard 41: a gate 42, an insulation layer (also referred to as GI layer or gate insulation layer) 43, an active layer 44, a drain and source layer formed by the source 451 and the drain 452, a passivation layer (PV) 46, and a flat layer 47.

The gate 42, the insulation layer 43, the active layer 44, the source 451, the drain 452, and the passivation layer 46 form a TFT in TFT layer 40. The OLED panel 20 is considered as a bottom-gate-type since the gate 42 is located below the active layer 44.

In combination with FIG. 2 and FIG. 3, the flat layer 47 covers on the passivation layer 46. A through hole $O_1$ is set in the TFT and passes through the passivation layer 46 and the flat layer 47, which exposes the upper surface of the drain 452. The anode 231 of the organic light-emitting unit 23 fills the through hole $O_1$ and contacts the drain 452, thereby achieving an electronic connection between the organic light-emitting unit 23 and the drain 452 of the TFT.

It should be understood that the TFT layer 40 can also be designed as a top-gate-type, based on which the TFT can be referred to related art and will not be repeated here.

Figure 5:
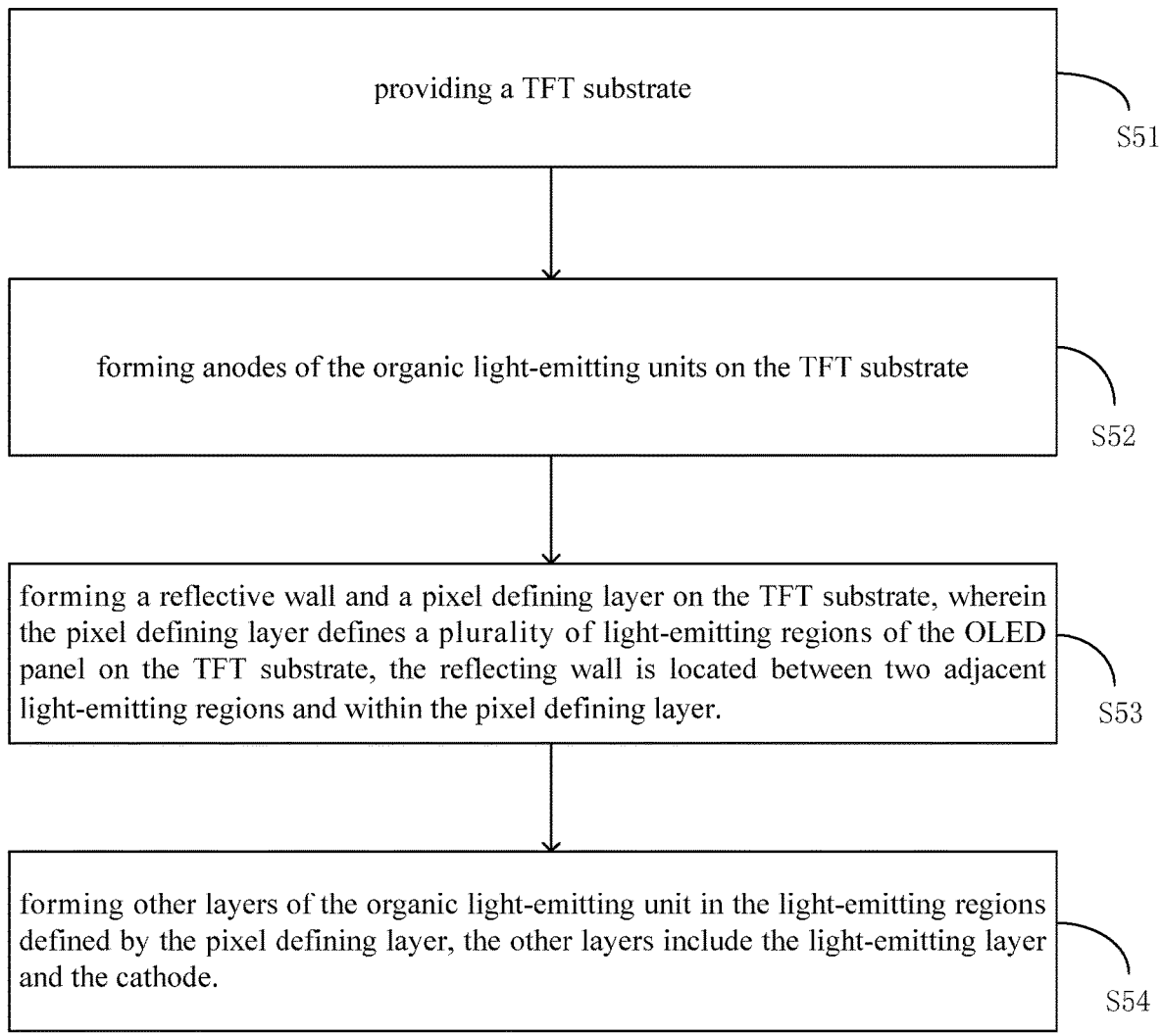
FIG. 5 is a schematic flow chart of a manufacturing method of an OLED panel according to an embodiment of the present disclosure.

Referring to FIG. 5, it shows a schematic flow chart of a manufacturing method of an OLED panel of the present disclosure. Refer to FIG. 5, the method for manufacturing of an OLED panel includes blocks S51 to S54.

S51: providing a TFT substrate.

The TFT substrate may include a baseboard, a TFT layer, and a flat layer. The TFT layer and the flat layer are located on the baseboard. The TFT layer includes a gate, a source, a drain, and an active layer etc. A through hole is set in the flat layer and exposes the drain of the TFT layer.

The baseboard can be a glass substrate, a plastic substrate, or a flexible substrate. The present disclosure does not limit structure and material of the TFT in the TFT layer, for example, the TFT may be of either the bottom-gate-type or top-gate-type.

When the TFT layer is the bottom-gate-type, the process of forming a TFT for the present disclosure may be described as follows:

The present disclosure may adopt the physical vapor deposition (PVD) method to form an entire metal layer on the substrate, and then the entire metal layer is patterned so that only the metal layer of the predetermined area is retained, thereby forming a gate. The patterning process may include photoresist coating, exposure, development, etching, etc.

The present disclosure may adopt the chemical vapor deposition (CVD) to form an insulating layer covering the entire side of the gate. The insulating layer may be made of a silicon oxide ($SiO_x$) material, or the insulating layer may include a silicon oxide layer covered with the gate and a silicon nitride layer covered with the silicon oxide layer, such as, the $SiO_2$ layer and the $Si_3N_4$ layer, to further improve the abrasion resistance and insulation performance of the insulating layer.

The present disclosure may adopt the CVD method to form an entire active layer, and then the entire active layer may be patterned so that only the portion of the entire active layer above the gate is retained, that is, the final active layer is formed. Of course, the present disclosure may also directly form the active layer by CVD method combined with a mask plate having a predetermined pattern.

The present disclosure may employ a patterned process identical to the gate manufacturing principle to form the source and the drain, and further form a passivation layer covering the source and the drain.

Here, the embodiment can produce the required TFT.

The flat layer is an entire structure over the TFT, on the basis of which the present disclosure may form the flat layer by either the CVD method or the coating PI (coated polyimide) material method. Further, the present disclosure may form through holes located above the drain of the TFT by etching the flat layer to expose the drain of the TFT.

S52: forming anodes of the organic light-emitting units on the TFT substrate.

The present disclosure may adopt a patterned process including photoresist coating, exposure, development, and etching processes to form the anodes. In particular, an entire metal layer is formed on the flat layer, and then an entire layer of photoresist is coated on the metal layer, and then a light mask is used to expose a predetermined area of the entire layer of photoresist, while the remaining photoresist is not exposed due to the shade of the light mask, and the photoresist of the exposed area can be removed by the development. The photoresist of the unexposed area is retained, and then the metal layer is etched, the metal layer not covered by the residual photoresist is etched away, and the metal layer covered by the residual photoresist is retained, to form the anodes with a predetermined pattern. The anode fills the through hole of the flat layer and contacts the drain of the TFT.

S53: forming a reflecting wall and a pixel defining layer on the TFT substrate, wherein the pixel defining layer defines a plurality of light-emitting regions of the OLED panel on the TFT substrate, and the reflecting wall is located between two adjacent light-emitting regions and within the pixel defining layer.

The present disclosure may form a pixel defining layer before forming a reflecting wall. In particular, taking the material of the pixel defining layer as an example of positive photoresist, the present disclosure may first form an entire positive photoresist on the TFT substrate, and then expose the positive photoresist with a light mask, the positive photoresist of the exposed area is removed by the development, and the positive photoresist of the unexposed area is retained, to form the pixel defining layer with a predetermined pattern, and then the pixel defining layer is exposed and developed again based on a light mask, to form grooves in the pixel defining layer, and finally to inject reflective material into the grooves to form the reflecting wall. However, when the pixel defining layer is made of other materials, the present disclosure may form a pixel defining layer on the TFT substrate using a patterning process including photoresist coating, exposure, development, and etching processes, and then grooves in the pixel defining layer is formed by etching process, and finally reflective material is injected into the grooves to form the reflecting wall.

Of course, the present disclosure may also form the reflecting wall before forming a pixel defining layer. In particular, the present disclosure may use laser interference photolithography process to form the reflecting wall on the TFT substrate. In particular, take the material of a pixel defining layer as an example of positive photoresist, first forming an entire positive photoresist on the TFT substrate, and then the positive photoresist is irradiated with at least two laser beams to produce a positive photoresist photosensitive pattern, that is, to produce a photoresist pattern, the positive photoresist of the exposed area is removed by development, while the positive photoresist of the unexposed area is retained, thereby forming a pixel defining layer with a predetermined pattern. The pixel defining layer wrapping the reflecting wall is then formed by the patterning process, or by evaporation plating, sputtering, etc.

S54: forming other layers of the organic light-emitting unit in the light-emitting region defined by the pixel defining layer. The other layers include the light-emitting layer and the cathode.

The present disclosure may adopt the evaporation plating process or the printing process to form the light-emitting layer and the cathode. Of course, the organic light-emitting unit also includes other layer structures, such as, electronic transport layer and electronic hole transport layer, which are not shown and can be fabricated using related art. Further, the present disclosure forms package layer to seal the structure formed by the preceding blocks S51 to S54.

The method of the embodiment can be used to manufacture an OLED panel having the same structure as the OLED panel 20. Therefore, the method has the same beneficial effect.

In addition, the present disclosure also provides an OLED display which has an OLED panel of the same structure as the OLED panel 20, and has the same beneficial effect.

The foregoing is merely embodiments of the present disclosure, and is not intended to limit the scope of the disclosure. Any transformation of equivalent structure or equivalent process which uses the specification and the accompanying drawings of the present disclosure, or directly or indirectly application in other related technical fields, are likewise included within the scope of the protection of the present disclosure.

What is claimed is:

1. An organic light-emitting diode (OLED) panel, comprising:
   a thin film transistor (TFT) substrate;

a pixel defining layer located on the TFT substrate, wherein the pixel defining layer defines a plurality of light-emitting regions of the OLED panel on the TFT substrate;

a reflecting wall located between two adjacent light-emitting regions and within the pixel defining layer; and a package layer located on a top surface of the pixel defining layer; wherein a top of the reflecting wall extends to the package layer;

wherein a bottom of the reflecting wall extends to the TFT substrate.

2. The OLED panel of claim 1, wherein each light-emitting region is surrounded by four reflecting walls connected head-to-tail.

3. The OLED panel of claim 1, wherein the reflecting wall comprises a plurality of spaced wall structures arranged around the light-emitting region.

4. The OLED panel of claim 1, wherein heights of the reflecting wall and the pixel defining layer are equal, and a thickness of the reflecting wall is unchanged or increased from top to bottom.

5. The OLED panel of claim 1, wherein light reflectivity of the reflecting wall is equal to or greater than 95%.

6. The OLED panel of claim 1, wherein a width of the pixel defining layer increases from the package layer to the TFT substrate.

7. An organic light-emitting diode (OLED) display, comprising:

an OLED panel comprising:
a thin film transistor (TFT) substrate;
a pixel defining layer located on the TFT substrate, wherein the pixel defining layer defines a plurality of light-emitting regions of the OLED panel on the TFT substrate;
a reflecting wall located between two adjacent light-emitting regions and within the pixel defining layer; and
a package layer located on a top surface of the pixel defining layer; wherein a top of the reflecting wall extends to the package layer;
wherein a bottom of the reflecting wall extends to the TFT substrate.

8. The OLED display of claim 7, wherein each light-emitting region is surrounded by four reflecting walls connected head-to-tail.

9. The OLED display of claim 7, wherein the reflecting wall comprises a plurality of spaced wall structures arranged around the light-emitting region.

10. The OLED display of claim 7, wherein heights of the reflecting wall and the pixel defining layer are equal, and a thickness of the reflecting wall is unchanged or increased from top to bottom.

11. The OLED display of claim 7, wherein light reflectivity of the reflecting wall is equal to or greater than 95%.

12. The OLED display of claim 7, wherein a width of the pixel defining layer increases from the package layer to the TFT substrate.

13. A manufacturing method of an organic light-emitting diode (OLED) panel, comprising:

providing a thin film transistor (TFT) substrate;
forming anodes of organic light-emitting units on the TFT substrate;
forming a reflecting wall and a pixel defining layer on the TFT substrate, wherein the pixel defining layer defines a plurality of light-emitting regions of the OLED panel on the TFT substrate, the reflecting wall is located between two adjacent light-emitting regions and within the pixel defining layer;
forming a light-emitting layer and a cathode of the organic light-emitting unit on the light-emitting region defined by the pixel defining layer; and
forming a package layer located on a top surface of the pixel defining layer;
wherein a top of the reflecting wall extends to the package layer;
wherein a bottom of the reflecting wall extends to the TFT substrate.

14. The method of claim 13, wherein each light-emitting region is surrounded by four reflecting walls connected head-to-tail.

15. The method of claim 14, wherein the forming the reflecting wall and the pixel defining layer on the TFT substrate comprises:
forming the pixel defining layer on the TFT substrate;
forming a groove in the pixel defining layer; and
injecting reflective material into the groove to form a reflecting wall.

16. The method of claim 14, wherein forming the reflecting wall wrapped in the pixel defining layer on the TFT substrate comprises:
forming the reflecting wall on the TFT substrate using a laser interference etching process; and
forming the pixel defining layer enveloping the reflecting wall.

17. The method of claim 13, wherein a width of the pixel defining layer increases from the package layer to the TFT substrate.

* * * * *